US012587006B2

(12) United States Patent
Pakala et al.

(10) Patent No.: US 12,587,006 B2
(45) Date of Patent: Mar. 24, 2026

(54) FAULT DETECTION SYSTEM AND METHOD FOR SWITCHED CAPACITOR CONVERTER

(71) Applicant: NXP USA, Inc., Austin, TX (US)

(72) Inventors: Sri Harsh Pakala, Chandler, AZ (US); Salvadore Frederick Talamo, Queen Creek, AZ (US); Hungjoong Lee, San Diego, CA (US); Peter Christiaans, Morgan Hill, CA (US)

(73) Assignee: NXP USA, Inc., Austin, TX (US)

( * ) Notice: Subject to any disclaimer, the term of this patent is extended or adjusted under 35 U.S.C. 154(b) by 140 days.

(21) Appl. No.: 18/391,271

(22) Filed: Dec. 20, 2023

(65) Prior Publication Data

US 2025/0210968 A1    Jun. 26, 2025

(51) Int. Cl.
  *H02H 7/12*      (2006.01)
  *G01R 31/3835*   (2019.01)
  *H02H 1/00*      (2006.01)

(52) U.S. Cl.
  CPC ....... *H02H 7/1213* (2013.01); *G01R 31/3835* (2019.01); *H02H 1/0007* (2013.01)

(58) Field of Classification Search
  CPC ............... H02H 7/1213; H02H 1/0007; G01R 31/3835; H02M 3/073; H02M 3/072; H02M 1/36; H02M 1/32
  See application file for complete search history.

(56) References Cited

U.S. PATENT DOCUMENTS

| | | | |
|---|---|---|---|
| 9,847,712 | B2 | 12/2017 | Low et al. |
| 2022/0393577 | A1 | 12/2022 | Shao et al. |
| 2023/0318449 | A1 | 10/2023 | Huang et al. |

FOREIGN PATENT DOCUMENTS

| | | |
|---|---|---|
| CN | 114487900 A | 5/2022 |
| EP | 3726715 B1 | 9/2021 |

*Primary Examiner* — Daniel Cavallari

(74) *Attorney, Agent, or Firm* — Andrew C. Milhollin

(57) ABSTRACT

System and methods of fault detection for switched capacitor converters are provided. A system includes a switched capacitor converter and fault detection circuitry. The switched capacitor converter is configured to perform direct current (DC)-to-DC conversion at a predefined conversion ratio and includes a first power stage having first switches and includes first capacitors having first terminals and second terminals. The fault detection circuitry is coupled to second terminals of the first capacitors and is configured to monitor second terminal voltages of the first capacitors and to assert at least one fault signal in response to determining that any of the second terminal voltages indicates a fault during a startup sequence of the switched capacitor converter.

15 Claims, 4 Drawing Sheets

FAULT DETECTION SYSTEM AND METHOD FOR SWITCHED CAPACITOR CONVERTER

TECHNICAL FIELD

Embodiments of the subject matter described herein relate generally to switched capacitor converters, including fault detection systems for switched capacitor converters.

BACKGROUND

Increases in the number of features and functionalities in smart handheld devices, such as smartphones, have led to increases total power consumption requirements and, in turn, quicker battery discharge and more frequent need for charging in such devices. Many such devices have both inductive and "fast" charging capabilities, where fast charging is intended to provide increased power while charging in an attempt to reduce the time the end-user spends in charging a device. Additionally, such devices often require reverse power transfer from the batter to support, for example, phone-to-phone or phone-to-device charging, requiring direct current (DC)-to-DC converters of the devices to be bidirectional (supporting both forward step-down conversion and reverse step-up conversion). Such requirements can render the application of conventional fault detection techniques to identify shorts or other faults in the DC-to-DC converters complicated and/or impractical.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, a system includes a switched capacitor converter configured to perform direct current (DC)-to-DC conversion at a predefined conversion ratio. The switched capacitor converter includes a first power stage including first switches and first capacitors coupled to the first power stage and having first terminals and second terminals. The system further includes fault detection circuitry coupled to the second terminals of the first capacitors of the switched capacitor converter, wherein the fault detection circuitry is configured to monitor second terminal voltages of the first capacitors, and assert at least one fault signal in response to determining that any of the second terminal voltages indicates a fault during a startup sequence of switched capacitor converter.

In one or more embodiments, the fault detection circuitry is further configured to disable the switched capacitor converter in response to assertion of the at least one fault signal.

In one or more embodiments, the fault detection circuitry is further configured to assert the at least one fault signal in response to determining that at least one of the second terminal voltages of the first capacitors is less than a first threshold voltage during a first time period in which the first terminals of the first capacitors are coupled to an output voltage of a battery of the system while the second terminals are floating.

In one or more embodiments, the fault detection circuitry is further configured to assert the at least one fault signal in response to determining that at least one of the second terminal voltages is greater than a second threshold voltage during a second time period in which the second terminals are coupled to a reference potential while first terminals of the first capacitors are coupled to the output voltage of the battery of the system.

In one or more embodiments, the fault detection circuitry further includes an analog-to-digital converter (ADC), and wherein the fault detection circuitry is further configured to obtain, with the ADC, a sampled output voltage value by sampling the output voltage of the battery before the first time period, and store a sampled output voltage value.

In one or more embodiments, the fault detection circuitry is further configured to compare a voltage at an overvoltage protection node coupled to the switched capacitor converter to a third threshold voltage after the first time period of the startup sequence, wherein the third threshold voltage is based on the sampled output voltage value, and disable the switched capacitor converter in response to determining that the voltage at the overvoltage protection node is less than the third threshold voltage.

In one or more embodiments, the fault detection circuitry is further configured to compare the voltage at the overvoltage protection node coupled to the switched capacitor converter to a fourth threshold voltage during a third time period of the startup sequence, wherein the fourth threshold voltage is based on the sampled output voltage value, and disable the switched capacitor converter in response to determining that the voltage at the overvoltage protection node is less than the third threshold voltage during the third time period, wherein the third time period corresponds to a half-sync switching state of the switched capacitor converter, and the third threshold voltage is greater than the output voltage of the battery.

In one or more embodiments, the first capacitors include flying capacitors configured to provide energy storage for the switched capacitor converter.

In one or more embodiments, the switched capacitor converter further includes a second power stage including second switches, and second capacitors coupled to the first power stage, the second capacitors being coupled to the fault detection circuitry.

In an example embodiment, a method includes, during a startup sequence of a switched capacitor converter, detecting, by fault detection circuitry coupled to the switched capacitor converter, a fault in the switched capacitor converter based on second terminal voltages of flying capacitors of the switched capacitor converter, the flying capacitors having first terminals and second terminals, and disabling, by the fault detection circuitry, the switched capacitor converter in response to detecting the fault.

In one or more embodiments, detecting the fault includes determining, by the fault detection circuitry, that at least one of the second terminal voltages of the flying capacitors indicates a pin fault based on comparisons of each of the second terminal voltages to a threshold voltage while the first terminals are coupled to an output voltage of a battery and the second terminals are floating.

In one or more embodiments, detecting the fault includes determining, by the fault detection circuitry, that at least one of the second terminal voltages of the flying capacitors indicates a capacitor plate short based on comparisons of each of the second terminal voltages to a threshold voltage while the second terminals are coupled to a reference potential and while the first terminals are coupled to an output voltage of a battery.

In one or more embodiments, a system includes fault detection circuitry configured to receive voltages from capacitors of a switched capacitor converter, the capacitors having first terminals and second terminals, and the fault detection circuitry including logic circuitry being configured to monitor the voltages in a first state of a startup sequence and a second state of the startup sequence, assert a first fault signal in response to determining that any of the voltages is greater than a first threshold voltage while in the first state, and assert a second fault signal in response to determining that any of the voltages is less than a second threshold voltage while in the second state.

In one or more embodiments, the capacitors including flying capacitors of the switched capacitor converter, and wherein voltages received by the fault detection circuitry include second terminal voltages of the second terminals of the flying capacitors.

In one or more embodiments, the fault detection circuitry further includes a finite state machine (FSM) configured to receive the first fault signal and the second fault signal from the logic circuitry, and disable the switched capacitor converter in response to assertion of either of the first fault signal or the second fault signal.

In one or more embodiments, the fault detection circuitry further includes an analog-to-digital converter (ADC) configured to sample voltages from each of an overvoltage protection node coupled to the switched capacitor converter and an output node of a battery coupled to the switched capacitor converter, and provide the sampled voltages to the FSM.

In one or more embodiments, the FSM is further configured to transition to the first state of a startup sequence of the switched capacitor converter in response to determining that a voltage at the overvoltage protection node is less than a third threshold voltage.

In one or more embodiments, the FSM is further configured to compare the voltage at the overvoltage protection node to a fourth threshold voltage after the first state of the startup sequence, wherein the fourth threshold voltage is based on a sampled output voltage value obtained and stored by the fault detection circuitry prior to the first state.

In one or more embodiments, the FSM is further configured to compare the voltage at the overvoltage protection node to a fifth threshold voltage during a third state of the startup sequence corresponding to a half-sync switching state of the switched capacitor converter, wherein the fifth threshold voltage is greater than an output voltage of the battery.

In one or more embodiments, the FSM is further configured to disable the switched capacitor converter in response to determining that the voltage at the overvoltage protection node is less than the fourth threshold voltage following the first state, or the voltage at the overvoltage protection node is less than the fifth threshold voltage at an end of the third state.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

4

Figure 1:
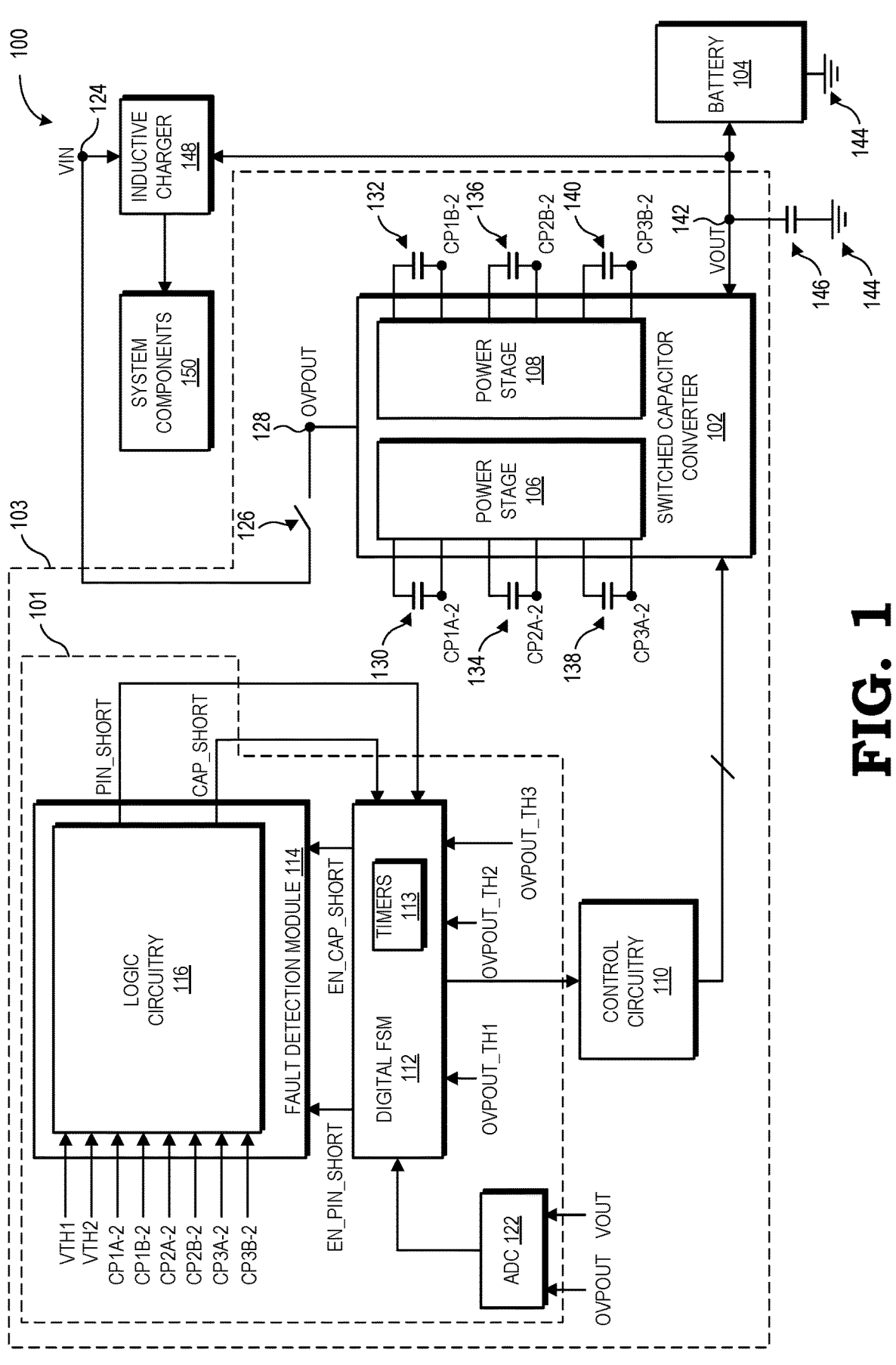
Figure 2:
Figure 2:
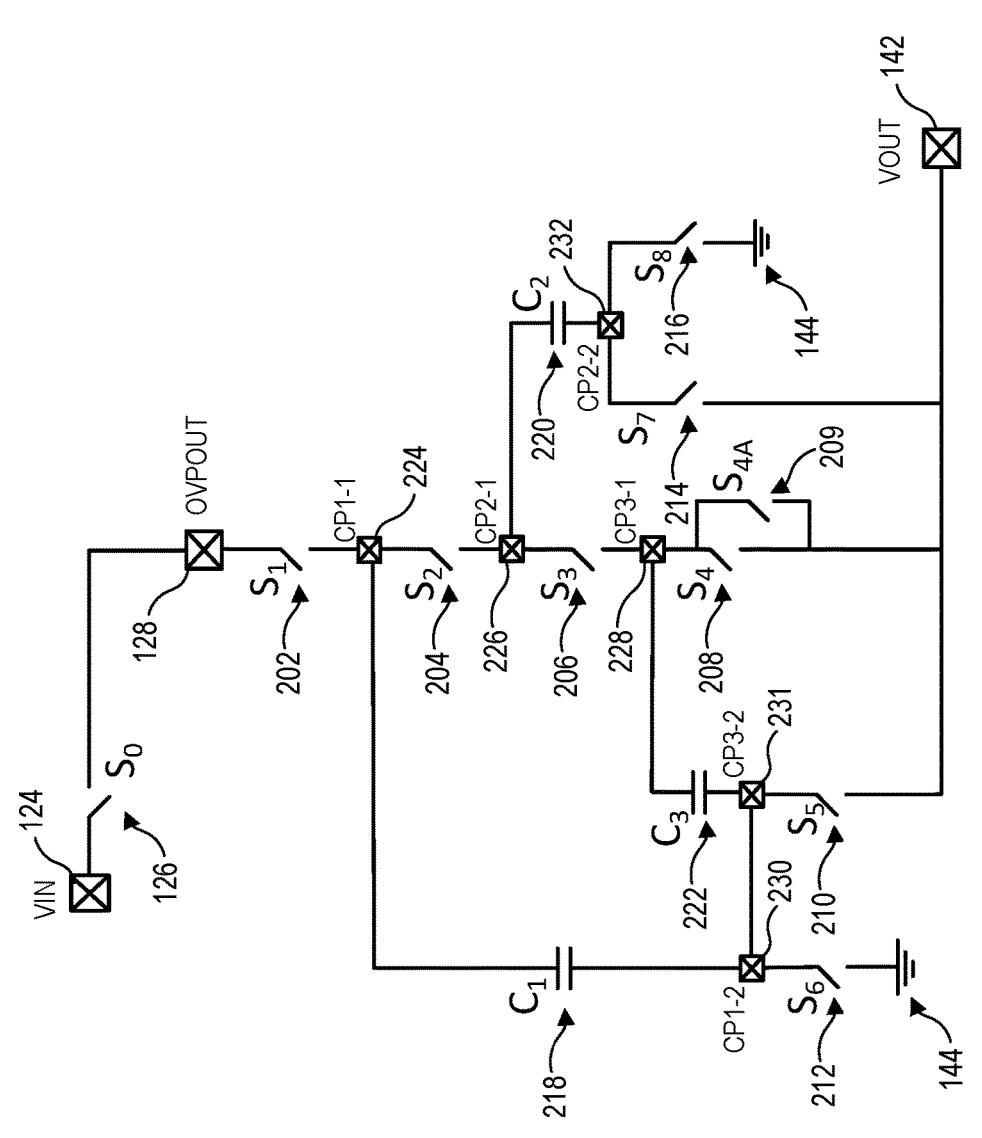

FIG. 1 is a block diagram illustrating an example system that includes a switched capacitor converter and fault detection circuitry configured to detect faults in the switched capacitor converter, in accordance with one or more embodiments;

FIG. 2 is a block diagram illustrating an example a switched capacitor converter arranged in accordance with a Dickson topology, in accordance with one or more embodiments.

Figure 3:
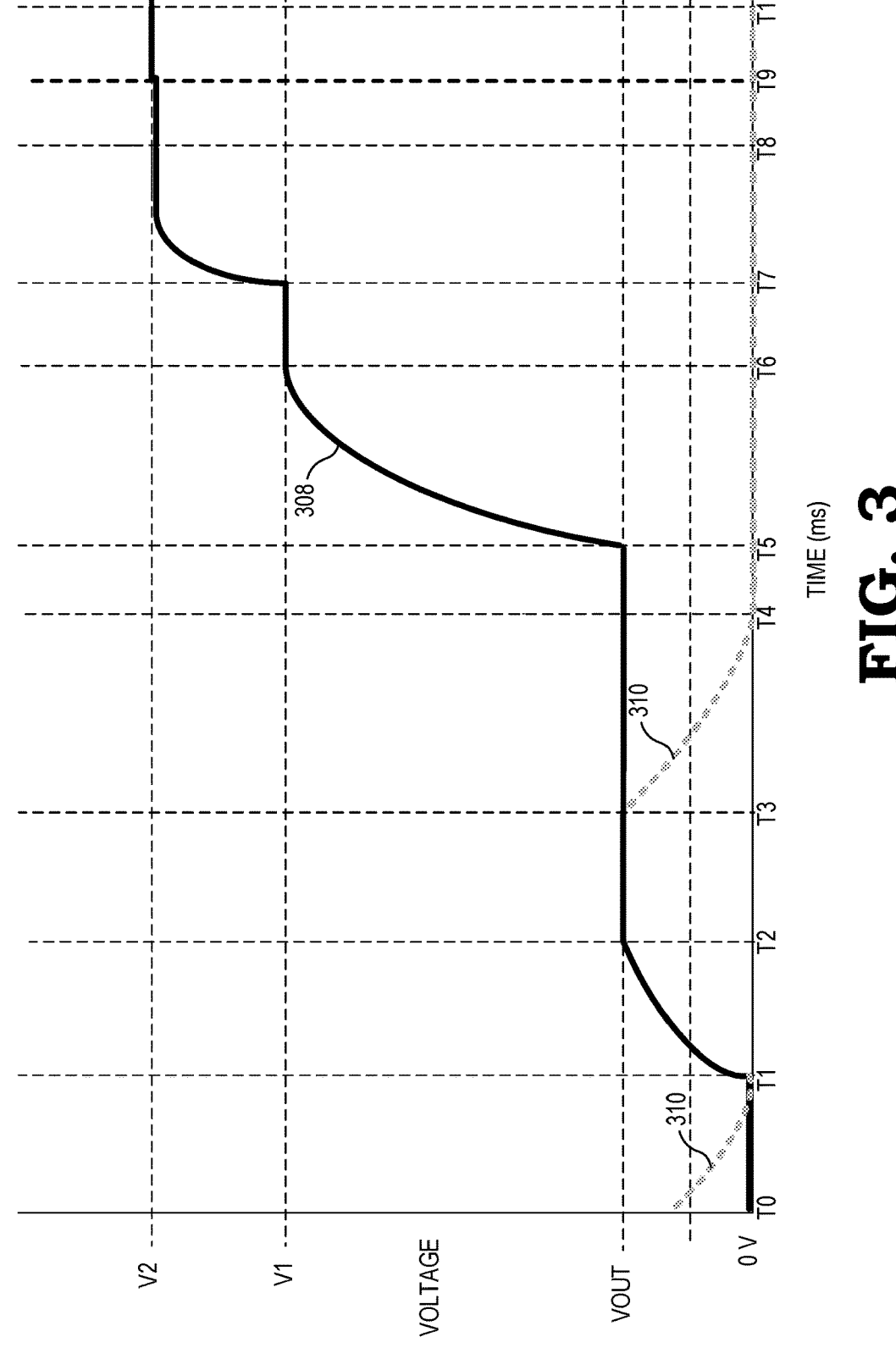
Figure 4:
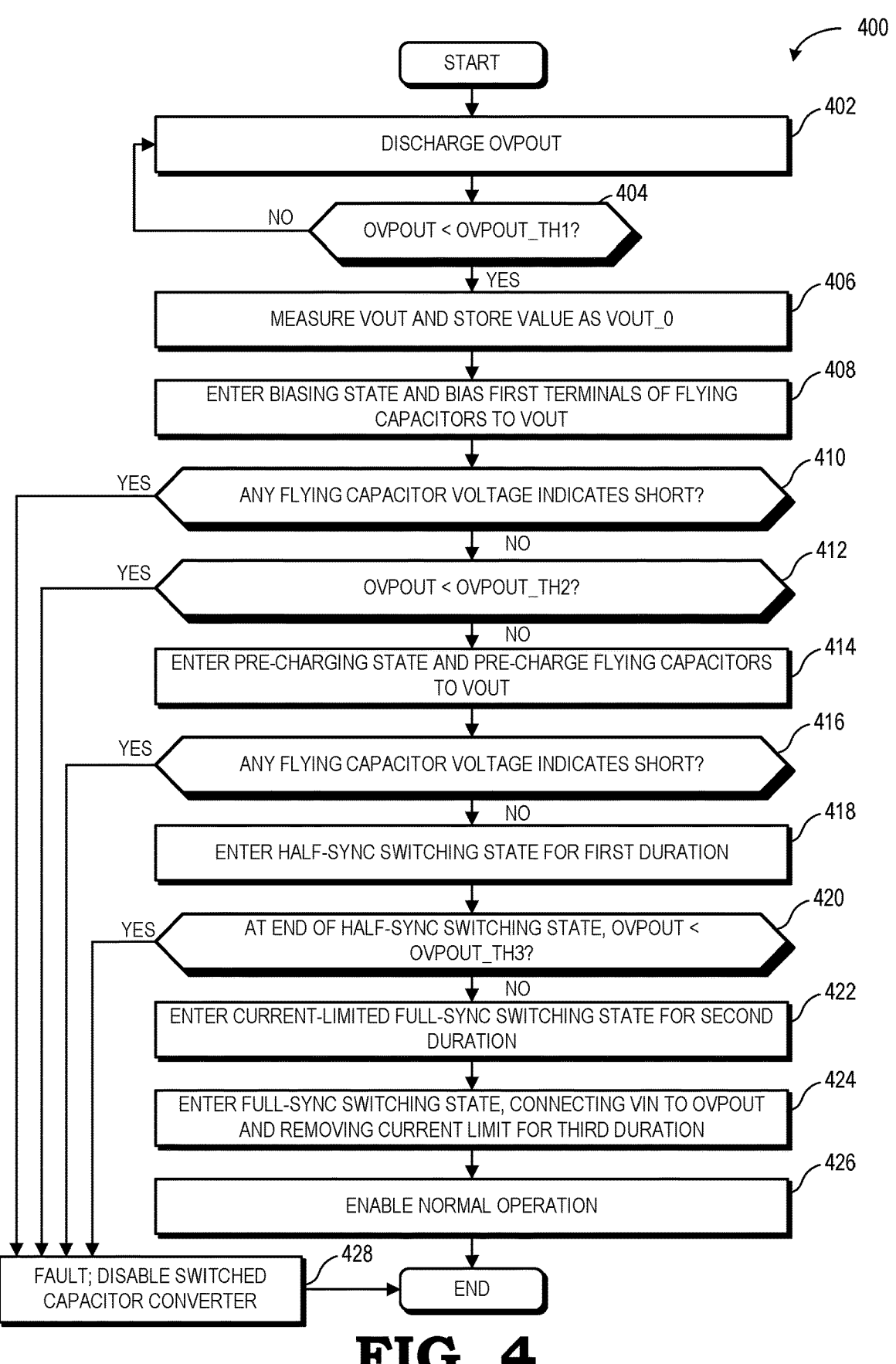

FIG. 3 is a diagram illustrating an overvoltage protection voltage (OVPOUT) and flying capacitor second terminal voltages over time during a startup sequence of a switched capacitor converter, such as the switched capacitor converter of FIG. 1, in accordance with one or more embodiments;

FIG. 4 is a process flow chart describing a method of fault detection that may be performed by fault detection circuitry, such as the fault detection circuitry of FIG. 1, during startup of a switched capacitor converter, such as the switched capacitor converter of FIG. 1, in accordance with one or more embodiments.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted for sake of brevity. Additionally, elements in the drawing figures are not necessarily drawn to scale. For example, the dimensions of some of the elements or regions in the figures may be exaggerated relative to other elements or regions to help improve understanding of embodiments described herein.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. As used herein, the words "exemplary" and "example" mean "serving as an example, instance, or illustration." Any implementation described herein as exemplary or an example is not necessarily to be construed as preferred or advantageous over other implementations. In addition, certain terms may also be used herein for reference only, and thus are not intended to be limiting.

Directional references such as "top," "bottom," "left," "right," "above," "below," and so forth, unless otherwise stated, are not intended to require any preferred orientation and are made with reference to the orientation of the corresponding figure or figures for purposes of illustration.

Various embodiments described herein relate to systems and methods for detecting faults in switched capacitor converters (e.g., which may be implemented to provide DC-to-DC conversion in electronic devices such as mobile phones, tablets, or the like), and particularly during the startup sequence of such switched capacitor converters. Switched capacitor converters use capacitors (sometimes referred to as "flying capacitors") as an energy storage element. Faults can occur in switched capacitor converters due to electrical shorting between the plates of individual flying capacitors or due to electrical shorting between adjacent pins of such switched capacitor converters, such as pins that are connected to a reference potential (e.g., ground; 0 V) and pins that are connected to the flying capacitors (e.g., if the flying capacitors are implemented out-of-package). Such electrical shorts may undesirably damage the switched capacitor converter.

In one or more embodiments, a system may include a switched capacitor converter and fault detection circuitry configured to detect faults in the switched capacitor converter. For example, the fault detection circuitry may be coupled to an overvoltage protection node and to second terminals of flying capacitors of a switched capacitor converter and may monitor voltages at these locations during a startup sequence of the switched capacitor converter. Herein, a "second terminal" of a flying capacitor of the switched capacitor converter is considered to be the terminal of the flying capacitor that is coupled to ground in a pre-charging state of the startup sequence of the switched capacitor converter, and the "first terminal" of such a flying capacitor is considered to be the terminal of the flying capacitor that is coupled to an input or output of the switched capacitor converter in the pre-charging state of the startup sequence of the switched capacitor converter. In a biasing state of the startup sequence, the first terminal voltages of the flying capacitors may be biased to a voltage VOUT, corresponding to an output voltage of a battery of the system coupled to an output of the switched capacitor converter, and the second terminal voltages of the flying capacitors may then float to VOUT. In the biasing state, the fault detection circuitry may monitor the second terminal voltages of the flying capacitors to determine whether the second terminal voltages are less than a threshold VTH1 (e.g., around 200 mV, as a non-limiting example). If the fault detection circuitry determines that the second terminal voltages are less than VTH1, this indicates that a pin short (i.e., a short between adjacent pins of the switched capacitor converter) has occurred, in response to which the fault detection circuitry may be configured to disable or turn off the switched capacitor converter.

In a pre-charging state of the startup sequence, following the biasing state, the second terminals of the flying capacitors may be connected to a reference potential (e.g., ground; 0 V), while the first terminals of the flying capacitors may be connected to VOUT. In the pre-charging state, the fault detection circuitry may monitor the second terminal voltages of the flying capacitors to determine whether the second terminal voltages are greater than a threshold VTH2 (e.g., around 0 V or 100 mV, as non-limiting examples). If the fault detection circuitry determines that the second terminal voltages are greater than around VTH2, this indicates that a capacitor plate short (i.e., a short between capacitor plates of an individual flying capacitor of the switched capacitor converter) has occurred, in response to which the fault detection circuitry may be configured to disable or turn off the switched capacitor converter.

FIG. 1 shows a block diagram of a system 100 that includes a battery 104, an inductive charger 148, system components 150, and a fast charger 103. The fast charger 103 includes fault detection circuitry 101, a switched capacitor converter 102, and control circuitry 110. In one or more embodiments, the system 100 may be a mobile device, such as a smart phone or tablet, as non-limiting examples.

The system components 150 may include one or more processor cores, memories, and/or peripheral components such as one or more cameras, speakers, or displays, as non-limiting examples. The inductive charger 148 is coupled to an input node 124, an output node 142, and the system components 150. The inductive charger 148 may be implemented as a conventional charger, such as a buck converter as a non-limiting example, which provides power to the system components 150 from the battery 104. In one or more embodiments, the battery 104 may be a single cell lithium battery, as a non-limiting example. An output capacitor 146 may be coupled between the output node 142 and a reference node 144 (e.g., configured to provide a ground voltage or other suitable reference potential).

The input node 124 may be configured to couple to either of an external power source (not shown) or a receiver device (not shown; e.g., another mobile device, such as another tablet, smart phone, smart watch, or the like that is to be charged by the system 100), such that power may be provided to the system 100 from the external power source when coupled to the node 124, and such that power may be provided from the system 100 to the receiver device when the receiver device is coupled to the node 124.

The inductive charger 148 may be configured to charge the battery 104 at a first rate when an external power source is connected to the input node 124. The fast charger 103 may be configured to charge the battery 104 at a second rate when an external power source is connected to the input node 124, where the second rate is higher than the first rate. For example, the fast charger 103 may have a comparatively higher charge rate than the inductive charger 148 because the fast charger 103 is configured to supply higher current to the battery 104 than the inductive charger 148.

Higher charging current may have a greater impact on battery longevity, particularly when the battery 104 is relatively near 100% state of charge (SoC) (i.e., near fully charged) or relatively near 0% SoC. In one or more embodiments, the fast charger 103 may be selected to charge the battery 104 in response to determining that the battery is within a first predetermined SoC (e.g., a range of between 30% to 80% of the charge capacity of the battery 104, as non-limiting example). The inductive charger 148 may be selected to charge the battery 104 in other predetermined SoC ranges (e.g., a range of between 0% and 30% or a range of between 80% and 100% as non-limiting examples).

The switched capacitor converter 102 of the fast charger 103 is coupled between the output node 142 and the input node 124. The switched capacitor converter 102 may be coupled to the input node 124 via a switch 126, which may be an overvoltage protection field effect transistor (FET). An overvoltage protection node 128 may be disposed between the switched capacitor converter 102 and the switch 126, where OVPOUT is the voltage at the node 128. The switched capacitor converter 102 may be configured to provide DC-to-DC conversion between the voltage, VIN, at the input node 124 and the voltage, VOUT, at the output node 142. In one or more embodiments, the switched capacitor converter 102 implements a Dickson topology and can provide multiple conversion ratios, including both forward conversion ratios (e.g., 4:1, 2:1, 1:1, etc.) and reverse conversion ratios (e.g., 1:4, 1:2, 1:1, etc.). For example, if configured to provide a forward conversion ratio of 4:1, given an input voltage VIN=20 V at the input node 124, the switched capacitor converter 102 steps down the input voltage VIN to provide an output voltage VOUT=5 V at the output node 142. As another example, if configured to provide a reverse conversion ratio of 1:2, given a voltage VIN=5 V at the input node 124, the switched capacitor converter steps up the input voltage VIN to provide a voltage VOUT=2.5 V at the output node 142.

The switched capacitor converter 102 may include power stages 106 and 108. The power stage 106 is coupled to flying capacitors 130, 134, and 138. The power stage 108 is coupled to flying capacitors 132, 136, and 140. Herein the term "flying capacitors" refers to capacitors that are used as energy storage elements for storing and transferring energy in connection with voltage conversion applications. In one or more embodiments, the flying capacitors 130, 132, 134, 136, 138, and 140 are separate from the integrated circuit that includes the power stages 106 and 108 of the switched capacitor converter 102. In one or more other embodiments, the flying capacitors 130, 132, 134, 136, 138, and 140 are formed on the same integrated circuit die and/or disposed in the same package as the power stages 106 and 108. During normal operation of the switched capacitor converter 102, each of the power stages 106 and 108 may each implement a Dickson topology in combination with the flying capacitors 130, 132, 134, 136, 138, and 140, which, when controlled by the control circuitry 110, provide DC-to-DC conversion at one or more predefined conversion ratios (e.g., 4:1, 2:1, 1:1, 1:2, or 1:4 as non-limiting examples) between VIN and VOUT. Prior to initiating normal operation, the switched capacitor converter 102 may perform a startup sequence, controlled by control circuitry 110 and a finite state machine (FSM) 112 of the fault detection circuitry 101. During this startup sequence, switches of the switched capacitor converter 102 may be controlled by the control circuitry 110 to bias or charge terminals of the flying capacitors 130, 132, 134, 136, 138, and 140 to various predetermined voltage levels over a sequence of predefined states while the voltage OVPOUT at the node 128 and the voltages C1A_2, C1B_2, C2A_2, C2B_2, C3A_2, and C3B_2 (sometimes referred to herein as "second terminal voltages") at the second terminals of the flying capacitors are monitored by the fault detection circuitry 101 to detect faults, as explained in more detail below.

While the switched capacitor converter 102 is shown to include two power stages 106 and 108 each coupled to three flying capacitors in the present example, it should be understood that this is intended to be illustrative and non-limiting. For example, in one or more other embodiments, more or fewer than three flying capacitors may be coupled to each power stage and/or more or fewer than two power stages may be included in the switched capacitor converter. In one or more such other embodiments, the second terminals of each flying capacitor would be coupled to inputs of the logic circuitry 116 for use in the detection of pin shorts and capacitor plate shorts.

The fault detection circuitry 101 is configured to detect faults (e.g., shorts between pins or flying capacitor plates of the switched capacitor converter 102, as non-limiting examples) that may occur during the startup sequence of the switched capacitor converter 102. The fault detection circuitry 101 includes a digital FSM 112 (sometimes referred to as the "FSM 112"), a multi-input analog-to-digital converter (ADC) 122, and a fault detection module 114. The ADC 122 may have inputs coupled to the nodes 128 and 142, such that the ADC 122 samples the voltages OVPOUT and VOUT. The FSM 112 may receive OVPUT and VOUT measurements from the ADC 122. In one or more embodiments, the FSM 112 may be configured to initiate a startup sequence of the switched capacitor converter 102, discharging the flying capacitors of the switched capacitor converter 102 in an initial state, then transitioning to from the initial state to a subsequent states of the startup sequence in response to determining that OVPOUT is significantly less than a threshold voltage OVPOUT_TH1 (e.g., 200 mV, as a non-limiting example), where such a condition may indicate that the flying capacitors of the switched capacitor converter 102 are sufficiently discharged.

The FSM 112 may control the switched capacitor converter 102 via communication with the control circuitry 110. The FSM 112 may include multiple timers 113, which may define time periods of one or more states of the startup sequence of the switched capacitor converter 102. The FSM 112 may receive threshold voltages OVPOUT_TH1, OVPOUT_TH2, and OVPOUT_TH3, and may be configured to compare the voltage OVPOUT (sampled by the ADC 122) to any or each of the threshold voltages OVPOUT_TH1, OVPOUT_TH2, and OVPOUT_TH3 during various states of the startup sequence of the switched capacitor converter 102, as described further below. The FSM 112 may be configured to selectively enable pin short detection by the fault detection module 114 via assertion of an enable signal EN_PIN_SHORT. Herein, a "pin short" refers to an electrical short between two or more adjacent pins of a device, such as an electrical short between one or more ground or reference pins and one or more pins coupled to terminals of the flying capacitors 130, 132, 134, 136, 138, and 140 the switched capacitor converter 102. The FSM 112 may be configured to selectively enable capacitor plate short detection by the fault detection module 114 via assertion of an enable signal EN_CAP_SHORT. Herein, a "capacitor plate short" refers to an electrical short between two plates of a capacitor, such as the flying capacitors 130, 132, 134, 136, 138, and 140.

The fault detection module 114 may include logic circuitry 116 having inputs coupled to the second terminals of the flying capacitors 130, 132, 134, 136, 138, and 140 of the switched capacitor converter. Through these inputs, the logic circuitry 116 may receive second terminal voltages CP1A-2, CP1B-2, CP2A-2, CP2B-2, CP3A-2, and CP3B-2. The logic circuitry 116 may include additional inputs through which threshold voltages VTH1 and VTH2 are provided to the logic circuitry 116.

In one or more embodiments, in response to assertion of the enable signal EN_PIN_SHORT by the FSM 112, the logic circuitry 116 is configured to compare each of the second terminal voltages CP1A-2, CP1B-2, CP2A-2, CP2B-2, CP3A-2, and CP3B-2 to the threshold voltage VTH1 (e.g., around 0.2 V as a non-limiting example). For example, the logic circuitry 116 may include comparators, each having an input that receives threshold voltage VTH1 and an input that receives a respective second terminal voltage, where outputs of these comparators indicate whether the respective second terminal voltage is less than or greater than the threshold volage VTH1. In response to determining that any second terminal voltage less than the threshold voltage VTH1 while EN_PIN_SHORT is asserted (e.g., in a biasing state of the startup sequence), the logic circuitry 116 may assert a fault signal PIN_SHORT, which the logic circuitry 116 provides to the FSM 112, to indicate that a pin short has been detected. The detection of pin shorts by the logic circuitry 116 based on the threshold voltage VTH1 is described in more detail below.

In one or more embodiments, in response to assertion of the enable signal EN_CAP_SHORT by the FSM 112, the logic circuitry 116 is configured to compare each of the second terminal voltages CP1A-2, CP1B-2, CP2A-2, CP2B-2, CP3A-2, and CP3B-2 to the threshold voltage VTH2 (e.g., around 0 V to around 0.1 V, as non-limiting examples). For example, the logic circuitry 116 may include comparators, each having an input that receives threshold voltage VTH2 and an input that receives a respective second terminal voltage, where outputs of these comparators indicate whether the respective second terminal voltage is less than or greater than the threshold volage VTH2. In response to determining that any second terminal voltage is greater than the threshold voltage VTH2, the logic circuitry 116 may assert a fault signal CAP_SHORT, which the logic circuitry 116 provides to the FSM 112, to indicate that a capacitor plate short has been detected. The detection of capacitor plate shorts by the logic circuitry 116 based on the threshold voltage VTH2 is described in more detail below.

In response to detection of a fault, the FSM 112 may cause the control circuitry 110 to disable or turn off the switched capacitor converter 102. In one or more embodiments, detection of a fault by the FSM 112 may occur in response to determining that any second terminal voltage is less than VTH1 while EN_PIN_SHORT is asserted in a biasing state, that any second terminal voltage is greater than VTH2 while EN_CAP_SHORT is asserted in a pre-charging state, that OVPOUT is less than OVPOUT_TH2 between the biasing state and the pre-charging state, that OVPOUT is less than OVPOUT_TH3 at the end of a half-sync switching state.

FIG. 2 shows an example of a switched capacitor converter 200 arranged in accordance with a Dickson topology. In one or more embodiments, the switched capacitor converter 200 is a DC-to-DC converter. The switched capacitor converter 200 may correspond to an embodiment of one of the power stages 106 and 108 (and corresponding flying capacitors) of the switched capacitor converter 102 of FIG. 1, with like elements sometimes denoted here using like reference numerals. When describing the switched capacitor converter 200 in the present example, reference is made to the system 100 of FIG. 1 and elements thereof. It should be understood that the switched capacitor converter 200 may include additional power stages (not shown), which may be coupled in parallel between the overvoltage protection node 128 and the output node 142, in accordance with one or more embodiments. In the present example, the switched capacitor converter 200 may provide DC-to-DC conversion (e.g., 1:4, 1:2, 2:1, 4:1, etc.) between VOUT (at node 142) and OVPOUT (at node 128) during normal operation.

The switched capacitor converter 200 includes an input node 124, an output node 142, an overvoltage protection node 128, switches 126, 202, 204, 206, 208, 209, 210, 212, 214, and 216 (denoted as $S_0$, $S_1$, $S_2$, $S_3$, $S_4$, $S_{4A}$, $S_5$, $S_6$, $S_7$, and $S_8$, respectively), and capacitors 218, 220, and 222 (denoted as $C_1$, $C_2$, and $C_3$, respectively). The switch 126 ($S_0$) is coupled between and is configured to selectively connect the input node 124 and the overvoltage protection node 128. The switch 202 ($S_1$) is coupled between and is configured to selectively connect the overvoltage protection node 128 and a node 224. The switch 204 ($S_2$) is coupled between and is configured to selectively connect the node 224 and a node 226. The switch 206 ($S_3$) is coupled between and is configured to selectively connect the node 226 and a node 228. The switch 208 ($S_4$) is coupled between and is configured to selectively connect the node 228 and the output node 142. The switch 209 ($S_{4A}$) is coupled in parallel with the switch 208 between the node 228 and the output node 142. The switch 210 ($S_5$) is coupled between and is configured to selectively connect a node 231 and the output node 142. The switch 212 ($S_6$) is coupled between and is configured to selectively connect a node 230 and the reference node 144. The switch 214 ($S_7$) is coupled between and is configured to selectively connect a node 232 and the output node 142. The switch 216 ($S_8$) is coupled between and is configured to selectively connect the node 232 to the reference node 144. The switches 202, 204, 206, 208, 209, 210, 212, 214, and 216 may collectively correspond to either of the power stages 106 and 108 of FIG. 1, in one or more embodiments.

The capacitor 218 ($C_1$) is coupled between (e.g., directly connected between) the node 224 and the node 230. The capacitor 218 has a second terminal voltage, CP1-2, that may be measured at the node 230 and the first terminal voltage, CP1-1, that may be measured at the node 224. In one or more embodiments, the capacitor 218 may correspond to the capacitor 130 or the capacitor 132 of the switched capacitor converter 102 of FIG. 1.

The capacitor 220 ($C_2$) is coupled between (e.g., directly connected between) the node 226 and the node 232. The capacitor 220 has a second terminal voltage, CP2-2, that may be measured at the node 232 and a first terminal voltage, CP2-1, that may be measured at the node 226. In one or more embodiments, the capacitor 220 may correspond to the capacitor 134 or the capacitor 136 of the switched capacitor converter 102 of FIG. 1.

The capacitor 222 ($C_3$) is coupled between (e.g., directly connected between) the node 228 and the node 231. The capacitor 222 has a second terminal voltage, CP3-2, that may be measured at the node 231 and a first terminal voltage, CP3-1, that may be measured at the node 228. As shown, the node 231 may be connected to the node 230, such that the second terminal voltage CP3-2 at the node 231 is the same as the second terminal voltage at the node 230 (i.e., CP3-2-CP1-2). In one or more other embodiments, the node 231 may instead be separate from the node 230 and selectively connected to the reference node 144 via a separate switch (not shown). In one or more embodiments, the capacitor 222 may correspond to the capacitor 136 or the capacitor 138 of the switched capacitor converter 102 of FIG. 1.

During a startup sequence of the switched capacitor converter 200, the switches 126, 202, 204, 206, 208, 209, 210, 212, 214, and 216 may be selectively controlled in accordance with a sequence of switching configurations. These switching configurations may be state-based, at least in that they may be dependent on the state of the switched capacitor converter 200. The switched capacitor converter 200 may be configured to progress through a sequence of states as part of the startup sequence, where this progression may be controlled by a state machine, such as the FSM 112 of FIG. 1. A non-limiting example of an illustrative startup sequence of the switched capacitor converter 200 will now be described.

In an initial state of the startup sequence, external discharging circuitry (not shown) may be used to discharge the flying capacitors 218, 220, and 222 and the node 128, such that OVPOUT and the top and second terminal voltages of the flying capacitors 218, 220, and 222 are (or, at least, are expected to be) equal to or approximately equal to the reference potential (e.g., 0 V). The switched capacitor converter 200 may transition from the initial state to the next state (e.g., the "first" or "biasing" state) upon determining that OVPOUT is less than the threshold OVPOUT_TH1, which may be 200 mV.

In one or more embodiments, when transitioning from the initial state to the first or biasing state, an ADC (e.g., the ADC 122 of FIG. 1) may sample a value of VOUT to obtain a value VOUT_0 (sometimes referred to herein as the "sampled output voltage value"), and store (e.g., latch) the value VOUT_0. VOUT_0 may be used when subsequently calculating the values of thresholds such as OVPOUT_TH2 and OVPOUT_TH3.

In a first state of the startup sequence, sometimes referred to as a "biasing state," the switches 126, 208, 210, 212, 214, and 216 are open and the switches 202, 204, 206, and 209 are closed (e.g., by the FSM 112 via the control circuitry 110 of FIG. 1). This switching configuration in the first state causes the first terminals of each of the flying capacitors 218, 220, and 222 and the node 128 to be coupled to the output node 142, thereby biasing the first terminals of the flying capacitors 218, 220, and 222 to VOUT while the second terminals of the flying capacitors 218, 220, and 222 are open or "floating". The voltage VOUT applied at the first terminals of the flying capacitors gradually cause the second terminal voltages to "float up" to VOUT. In one or more embodiments, in the biasing state, fault detection circuitry (e.g., fault detection circuitry 101 of FIG. 1) coupled to the nodes 230, 231, and 232 of the switched capacitor converter 200 may monitor the second terminal voltages CP1-2, CP2-2, and CP-3-, as described above, to detect pin shorts. The switch 209 may be smaller (i.e., having greater "ON" resistance) than the switch 208, and may be used to connect the node 228 to the node 142 instead of the switch 208 in the biasing state in order to reduce current flow in the event of a pin short at any of the flying capacitors 218, 220, and 222. In subsequent states of the startup sequence, after determining that a pin fault has not occurred at any of the flying capacitors 218, 220, and 222, the larger switch 208 may be used to connect the output node 142 to the node 228, which may allow for faster charging of the flying capacitors 218, 220, and 222.

In one or more embodiments, when transitioning from the biasing state to a "second" or "pre-charging state", the voltage OVPOUT at the node 128 may be sampled (e.g., by the ADC 122 of FIG. 1) and OVPOUT may be compared to the threshold OVPOUT_TH2 (e.g., by the FSM 112 of FIG. 1). In one or more embodiments, OVPOUT_TH2 may be equal to VOUT_0 minus a voltage offset (e.g., around 1 V as a non-limiting example). In response to determining that OVPOUT is less than OVPOUT_TH2, indicating that OVPOUT is not sufficiently charged (e.g., due to a defect in the switched capacitor converter 200), fault detection circuitry (e.g., the FSM 112 of the fault detection circuitry 101 of FIG. 1) indicates a fault and may disable the switched capacitor converter 200.

In a second state of the startup sequence, sometimes referred to as a "pre-charging state," the switches 126, 210, and 214 are open and the switches 202, 204, 206, 208, 212, and 216 are closed (e.g., by the FSM 112 via the control circuitry 110 of FIG. 1). This switching configuration in the second state causes the first terminals of each of the flying capacitors 218, 220, and 222 and the node 128 to be coupled to the output node 142 and causes the second terminals of each of the flying capacitors 218, 220, and 222 to be coupled to the reference node(s) 144. By coupling the second terminals of the flying capacitors 218, 220, and 222 to the reference potential while the first terminals are at VOUT, the second terminal voltages are gradually reduced to the reference potential (e.g., such that the voltage across each of the flying capacitors is around VOUT, given a reference potential of 0 V). In one or more embodiments, in the pre-charging state, fault detection circuitry (e.g., fault detection circuitry 101 of FIG. 1) coupled to the nodes 230, 231, and 232 of the switched capacitor converter 200 may monitor the second terminal voltages CP1-2, CP2-2, and CP3-2, as described above, to detect capacitor plate shorts. In one or more embodiments, the switches 212 and 216 are not necessarily closed (turned on) simultaneously when entering the pre-charging state. For example, the switch 212 may be closed before closing the switch 216 when entering the pre-charging state, which may advantageously reduce in-rush current in the switched capacitor converter 200. In a third state of the startup sequence, sometimes referred to as a "half-sync switching state," the switches 126 and 209 may be open, and the switching configuration for the switches 202, 204, 206, 208, 209, 210, 212, 214, and 216 used may change depending on the conversion ratio of the switched capacitor converter 200, as illustrated in Table 1:

TABLE 1

| Conversion Ratio | S1 | S2 | S3 | S4 | S5 | S6 | S7 | S8 |
|---|---|---|---|---|---|---|---|---|
| 4:1 or 1:4 | OFF | OFF | OFF | OFF | $\Phi$1 | $\Phi$2 | $\Phi$2 | $\Phi$1 |
| 2:1 or 1:2 | OFF | OFF | OFF | OFF | $\Phi$1 | $\Phi$2 | $\Phi$1 | $\Phi$2 |
| 1:1 | ON | ON | ON | ON | OFF | ON | OFF | ON |

As shown in the example of Table 1, for a 4:1 or 1:4 conversion ratio, the switches 202, 204, 206, and 208 may be open, the switches 210 and 216 may be clocked (i.e., periodically toggled between open and closed states) using a first signal having a phase $\Phi$1, and the switches 212 and 214 may be clocked using a second signal having a phase $\Phi$2, where $\Phi$1 and $\Phi$2 are at or around 180 degrees out of phase with respect to one another. For a 2:1 or 1:2 conversion ratio, the switches 202, 204, 206, and 208 may be open, the switches 210 and 214 may be clocked using the first signal with phase $\Phi$1, and the switches 212 and 216 may be clocked using the second signal with phase $\Phi$2. For a 1:1 conversion ratio, the switches 202, 204, 206, 208, 212, and 216 may be closed and the switches 210 and 214 may be open.

In one or more embodiments, at the end of the half-sync switching state, fault detection circuitry (e.g., FSM 112 of FIG. 1) coupled to the node 128 of the switched capacitor converter 200 may monitor the voltage OVPOUT, as described above, to detect faults (e.g., by comparing OVPOUT to OVPOUT_TH3. For example, faults detected in the half-sync switching state may be caused by unexpectedly high transistor resistance values, transistor gate leakage, gate driver errors, or the like, which may prevent OVPOUT from reaching the expected voltage level of OVPOUT_TH3, which may be the equal to ((VOUT_0*X)–Y) where X is an integer that is determined based on to the conversion ratio of the switched capacitor converter 200 (e.g., 4 for 4:1, 2 for 2:1, 1 for 1:1, as non-limiting examples) and where Y is a configurable value between, for example, 2 V and 4 V (e.g., 2 V, 2.5 V, 3 V, or 3.5 V, as non-limiting examples). In response to such faults, fault detection circuitry (e.g., fault detection circuitry 101 of FIG. 1) coupled to the switched capacitor converter 200 may indicate a fault, in response to which the switched capacitor converter 200 may be disabled. OVPOUT_TH3 may be greater than VOUT, in one or more embodiments.

In a fourth state of the startup sequence, sometimes referred to as a "current-limited full-sync switching state," the switches 126 and 209 may be open, and the switching configuration for the switches 202, 204, 206, 208, 209, 210, 212, 214, and 216 used may change depending on the conversion ratio of the switched capacitor converter 200, as illustrated in Table 2:

TABLE 2

| Conversion Ratio | S1 | S2 | S3 | S4 | S5 | S6 | S7 | S8 |
|---|---|---|---|---|---|---|---|---|
| 4:1 or 1:4 | Φ1 | Φ2 | Φ1 | Φ2 | Φ1 | Φ2 | Φ2 | Φ1 |
| 2:1 or 1:2 | Φ1 | ON | ON | Φ2 | Φ1 | Φ2 | Φ1 | Φ2 |
| 1:1 | ON | ON | ON | ON | OFF | ON | OFF | ON |

As shown in the example of Table 2, for a 4:1 or 1:4 conversion ratio, the switches 202, 206, 210 and 216 may be clocked using the first signal with phase Φ1, and the switches 204, 208, 212, and 214 may be clocked using the second signal with phase Φ2. For a 2:1 or 1:2 conversion ratio, the switches 204 and 206 may be closed, the switches 202, 210, and 214 may be clocked using the first signal with phase Φ1, and the switches 208, 212, and 216 may be clocked using the second signal with phase Φ2. For a 1:1 conversion ratio, the switches 202, 204, 206, 208, 212, and 216 may be closed and the switches 210 and 214 may be open.

In a fifth state of the startup sequence, sometimes referred to as a "full-sync switching state," the switching configuration of the switched capacitor converter 200 may be the same as in the current-limited full-sync switching state, but with the current limit disabled and the switch 126 closed to connect the node 128 to the node 124 (such that VIN≈OVPOUT). The startup sequence may transition from the current-limited full-sync switching state to the full-sync switching state upon expiration of a timer, for example.

After entering the full-sync switching state, normal operation of the switched capacitor converter 200 is enabled (e.g., by the fault detection circuitry and/or control circuitry coupled to the switched capacitor converter 200). During normal operation, the switch 126 is closed and the switches 202, 204, 206, 208, 210, 212, 214, and 216 are selectively controlled (e.g., by the control circuitry 110) to charge the flying capacitors 218, 220, and 222 to provide DC-to-DC conversion (e.g., 1:4, 1:2, 2:1, 4:1, etc.) between VIN and VOUT.

It should be understood that, for one or more embodiments in which the switched capacitor converter 200 includes one or more other power stages in addition to the power stage shown in the present example, the switching configurations associated with each state of the startup sequence described in the present example may be similarly applied at the other power stages.

FIG. 3 shows a diagram 300 illustrating a startup sequence of a switched capacitor converter. For example, the illustrated startup sequence may be applied to one or more embodiment of the switched capacitor converter 102 of FIG. 1 or the switched capacitor converter 200 of FIG. 2, as non-limiting examples. While diagram 300 is described below with reference to the system 100 of FIG. 1 and elements thereof, it should be understood that the startup sequence represented in the diagram 300 may be applied to other suitable systems with switched capacitor converters.

The diagram 300 includes a curve 308 representing the expected voltage OVPOUT at the overvoltage protection node 128 and a curve 310 representing the expected second terminal voltages for the flying capacitors of the switched capacitor converter 102.

In an initial state, from time T0 to time T1, the FSM 112 monitors OVPOUT, measured by the ADC 122, as the flying capacitors of the switched capacitor converter 102 are discharged to a reference potential (around 0 V in the present example). The FSM 112 may transition from the initial state to the biasing state, in response to determining that OVPOUT is less than OVPOUT_TH1 (e.g., around 200 mV).

At time T1, the FSM 112 controls the power stages of the switched capacitor converter 102 to cause the first terminals of the flying capacitors of the switched capacitor converter 102 to be connected to the VOUT, while the second terminal voltages are kept floating. In the biasing state, from time T1 to time T3 (sometimes referred to as a "first time period"), the second terminals voltages of the flying capacitors are floated up to VOUT, and OVPOUT similarly gradually increases to VOUT. Between time T2 to time T3, the FSM 112 asserts the signal EN_PIN_SHORT, in response to which the logic circuitry 116 of the fault detection module 114 compares the second terminal voltages to the threshold VTH1 to determine whether any pin shorts have occurred which would prevent any second terminal voltage affected by such a pin short from being raised to VOUT. At time T3, the FSM 112 determines whether the signal PIN_SHORT has been asserted by the logic circuitry 116 (i.e., in response to detection of a pin short), and proceeds to the pre-charging state in response to determining that PIN_SHORT is not asserted. Alternatively, in response to determining that PIN_SHORT is asserted, the FSM 112 indicates a fault and disables or turns off the switched capacitor converter 102.

At or around time T3, the FSM 112 compares OVPOUT to OVPOUT_TH2 to determine whether the overvoltage protection node is sufficiently charged. In response to determining that OVPOUT is less than OVPOUT_TH2, the FSM 112 indicates a fault and disables or turns off the switched capacitor converter 102.

At time T3, the FSM 112 controls the power stages of the switched capacitor converter 102 to cause the second terminals of the flying capacitors to be connected to the reference potential (0 V in the present example). In the pre-charging state, between time T3 and time T5 (sometimes referred to as a "second time period"), the second terminal voltages gradually transition from VOUT to 0 V. At time T4, the FSM 112 asserts the signal EN_CAP_SHORT, in response to which the logic circuitry 116 of the fault detection module 114 compares the second terminal voltages to the threshold VTH2 to determine whether any capacitor plate shorts have occurred which would prevent any second terminal voltage affected by such a capacitor plate short from being decreased to 0 V. At time T5, the FSM 112 determines whether the signal CAP_SHORT has been asserted by the logic circuitry 116 (i.e., in response to detection of a capacitor plate short) and proceeds to the half-sync switching state in response to determining that CAP_SHORT is not asserted. Alternatively, in response to determining that CAP_SHORT is asserted, the FSM 112 indicates a fault and disables or turns off the switched capacitor converter 102.

At time T5, the FSM 112 controls the power stages of the switched capacitor converter 102 in accordance with the half-sync switching state (e.g., as described above in the example of FIG. 2). In the half-sync switching state, from time T5 to time T7 (sometimes referred to as a "third time period"), the power stages of the switched capacitor converter 102 are controlled by the control circuitry 110 to charge OVPOUT to a voltage V1. In one or more embodiments, V1 may correspond to the threshold OVPOUT_TH3, defined above. In one or more embodiments, the FSM 112 monitors OVPOUT from time T6 to time T7 to determine whether OVPOUT is greater than or equal to the voltage V1 (e.g., based on comparison of OVPOUT to the threshold OVPOUT_TH3). In response to determining that OVPOUT is greater than or equal to V1 at time T7, the FSM 112 proceeds to the current-limited full-sync switching state. Alternatively, in response to determining that OVPOUT is not greater than or equal to the voltage V1, the FSM 112 indicates a fault and disables or turns off the switched capacitor converter 102.

At time T7, the FSM 112 controls the power stages of the switched capacitor converter 102 in accordance with the current-limited full-sync switching state (e.g., as described above in the example of FIG. 2). In the current-limited full-sync switching state, from time T7 to time T9 (sometimes referred to as a "fourth time period"), the power stages of the switched capacitor converter 102 are controlled by the control circuitry 110 to charge OVPOUT to a voltage V2. The voltage V2 may be the target output voltage of the switched capacitor converter 102 (e.g., for a 4:1 conversion ratio, the target output voltage V2 may be 4*VOUT, as a non-limiting example). Upon expiration of a timer associated with the fourth time period, the FSM 112 proceeds to the full-sync switching state.

At time T9, the FSM 112 controls the power stages of the switched capacitor converter 102 in accordance with the full-sync switching state (e.g., as described above in the example of FIG. 2). In the full-sync switching state, from time T9 to time T11 (sometimes referred to as a "fifth time period"), the power stages of the switched capacitor converter 102 are controlled by the control circuitry 110 to charge OVPOUT to the voltage V2 without a current limit. For example, current limiting circuitry (not shown) coupled to the switched capacitor converter may be disconnected, turned off, or otherwise disabled at time T9 to remove the current limit from the switched capacitor converter 102.Upon expiration of a timer associated with the fifth time period, the startup sequence is complete and the FSM 112 initiates normal operation of the switched capacitor converter 102.

FIG. 4 shows an illustrative process flow for a method 400 by which faults, including pin shorts and capacitor plate shorts, may be detected during a startup sequence of a switched capacitor converter (e.g., the switched capacitor converter 102 of FIG. 1). The method 400 is described with reference to elements of the system 100 of FIG. 1, including the fault detection circuitry 101 and the switched capacitor converter 102. However, it should be understood that this is illustrative and not limiting, at least in that other suitable switched capacitor converter and fault detection systems may be used to carry out the method 400 in one or more other embodiments.

At block 402, the over voltage protection node 128 of the switched capacitor converter 102 is discharged by external discharge circuitry (not shown), thereby discharging the voltage OVPOUT to be at or around a reference voltage (e.g., 0 V).

At block 404, the digital FSM 112 performs a comparison of the voltage OVPOUT at the overvoltage protection node 128 to a threshold OVPOUT_TH1, which may be equal to 200 mV. If the digital FSM 112 determines that OVPOUT is less than OVPUT_TH1 as a result of this comparison, indicating that the capacitors of the switched capacitor converter 102 are sufficiently discharged, then the method 400 proceeds to block 406. If the digital FSM 112 determines that OVPOUT is not less than OVPOUT_TH1, indicating that the capacitors of the switched capacitor converter 102 are not sufficiently discharged, then the method 400 returns to block 402 to continue discharging the node 128 and OVPOUT. In this way, the digital FSM 112 may delay transition to the biasing state of the switched capacitor converter 102 until it is determined that the node 128 (and flying capacitors that may be coupled thereto) are sufficiently discharged.

At block 406, the voltage VOUT at the output node 142 of the switched capacitor converter 102 is sampled by the ADC 122 and stored as VOUT_0. The value VOUT_0 may be subsequently used as a basis for determining the values of thresholds to which OVPOUT is to be compared.

At block 408, the switched capacitor converter 102 enters a biasing state in which the control circuitry 110 controls the power stages (e.g., switches thereof) of the switched capacitor converter 102 to bias first terminals of each of the flying capacitors (e.g., the flying capacitors 130, 132, 134, 136, and 140) of the switched capacitor converter 102 to the voltage VOUT. In one or more embodiments, the first terminals of the flying capacitors may be coupled to the voltage VOUT, and the second terminals of the flying capacitors may be open, such that the second terminal voltages are gradually floated up to VOUT.

At block 410, the fault detection module 114 determines whether any of the second terminal voltages (e.g., second terminal voltages C1A-2, C1B-2, C2A-2, C2B-2, C3A-2, C3B-2) of the flying capacitors indicate a short in the switched capacitor converter 102. For example, since the second terminals of the flying capacitors are expected to be biased to VOUT at block 408, the second terminal voltages of the flying capacitors may each be compared, using the logic circuitry 116 (e.g., one or more comparators thereof), to a first threshold voltage VTHR1 in order to determine whether a pin short has occurred in the switched capacitor converter 102. In one or more embodiments, the first threshold voltage VTHR1 may be a positive voltage that is between a reference potential (e.g., a ground voltage VGND; 0 V) and VOUT. In one or more embodiments, the first threshold voltage VTHR1 may be equal to or approximately equal to 0.2 V. The logic circuitry 116 may assert the signal PIN_SHORT to indicate detection of a pin short in the switched capacitor converter 102 in response to determining that any of the flying capacitor second terminal voltages are less than VTHR1. In one or more embodiments, the signal EN_PIN_SHORT is asserted by the digital FSM 112 at the block 410 to enable the portions of the logic circuitry 116 that are allocated for pin short detection.

It should be understood that the example of performing direct comparisons of each flying capacitor second terminal voltage to a threshold to detect pin shorts in the switched capacitor converter 102 is intended to be illustrative and non-limiting, and that other suitable approaches for detecting pin shorts based on the flying capacitor second terminal voltages may instead be performed at block 410. For example, in one or more other embodiments, the second terminal of each of the flying capacitors of the switched capacitor converter 102 is coupled to a respective transistor gate of a group of parallel-coupled transistors (e.g., PMOS transistors) in a first logic circuit of the logic circuitry 116, where the group of parallel-coupled transistors have source terminals that are each coupled to a positive voltage. In one or more such other embodiments, when any second terminal voltage of the flying capacitors, relative to the voltage at the source terminals of the parallel transistors, drops below a corresponding gate threshold voltage at block 410 (e.g., while EN_PIN_SHORT is asserted by the digital FSM 112), the associated transistor closes, connecting the positive voltage to an output of the first logic circuit. The output of the first logic circuit may be provided to a first comparator, which may compare the output of the first logic circuit to a threshold, and the output of the first comparator may indicate a short circuit (e.g., causing the PIN_SHORT signal to be asserted to indicate a pin short) when the output of the first logic circuit is connected to the positive voltage.

If, at block 410, the fault detection module 114 determines that any second terminal voltage of the flying capacitors indicates a short (e.g., PIN_SHORT is asserted), then the method 400 proceeds to block 428 at which the digital FSM 112 causes the control circuitry 110 to disable or otherwise turn off the switched capacitor converter 102 due to the detected fault. Otherwise, if the fault detection module 114 determines that none of the second terminal voltages of the flying capacitors indicate a short (e.g., PIN_SHORT is not asserted), then the method 400 proceeds to block 412.

At block 412, following the biasing state, the digital FSM 112 compares the value of OVPOUT, as measured by the ADC 122, to the threshold OVPOUT_TH2. In one or more embodiments, OVPOUT_TH2 may be equal to VOUT_0 minus a voltage offset (e.g., around 1 V as a non-limiting example). In response to determining that OVPOUT is less than OVPOUT_TH2, indicating that OVPOUT is not sufficiently charged (e.g., due to a defect in the switched capacitor converter 200), the method 400 proceeds to block 428 at which FSM 112 the digital FSM 112 causes the control circuitry 110 to disable or otherwise turn off the switched capacitor converter 102 due to the detected fault. Otherwise, in response to determining that OVPOUT is not less than OVPOUT_TH2, indicating that OVPOUT is sufficiently charged, the method 400 proceeds to block 414.

At block 414, the switched capacitor converter 102 enters a pre-charging state in which the control circuitry 110 controls the power stages (e.g., switches thereof) of the switched capacitor converter 102 to pre-charge the flying capacitors of the switched capacitor converter 102 to VOUT. For example, the control circuitry 110 may control the switches of the power stages 106 and 108 to connect first terminals of the flying capacitors of the switched capacitor converter 102 to VOUT and to connect the second terminals of the flying capacitors of the switched capacitor converter 102 to the reference potential (e.g., the ground voltage VGND; 0 V).

At block 416, the fault detection module 114 determines whether any of the second terminal voltages of the flying capacitors indicate a short. For example, since the second terminals of the flying capacitors are expected to be biased to the reference potential (e.g., 0 V) at block 414, the second terminal voltages of the flying capacitors may be compared, using the logic circuitry 116 (e.g., one or more comparators thereof), to a second threshold voltage VTHR2 in order to determine whether a capacitor plate short has occurred in the switched capacitor converter 102. In one or more embodiments, the second threshold voltage VTHR2 may be equal to or approximately equal to the reference potential (e.g., a ground voltage; 0 V), as a non-limiting example. In one or more embodiments, the second threshold voltage VTHR2 may be between around 0 V and around 0.1 V, as a non-limiting example. The logic circuitry 116 may assert the signal CAP_SHORT to indicate a capacitor plate short in one or more of the flying capacitors of the switched capacitor converter 102 in response to determining that any of the flying capacitor second terminal voltages are greater than VTHR2. In one or more embodiments, the signal EN_CAP_SHORT is asserted by the digital FSM 112 at the block 416 to enable the portions of the logic circuitry 116 that are allocated for capacitor plate short detection.

It should be understood that the example of performing direct comparisons of each flying capacitor second terminal voltage to a threshold to detect capacitor plate shorts in the switched capacitor converter 102 is intended to be illustrative and non-limiting, and that other suitable approaches for detecting capacitor plate shorts based on the flying capacitor second terminal voltages may instead be performed at block 416. For example, in one or more other embodiments, the second terminal of each of the flying capacitors of the switched capacitor converter 102 is coupled to a respective transistor gate of a group of parallel-coupled transistors (e.g., NMOS transistors) in a second logic circuit of the logic circuitry 116, where the group of parallel-coupled transistors have source terminals that are each coupled to a ground voltage. In one or more such other embodiments, when any second terminal voltage of the flying capacitors, relative to the voltage at the source terminals of the parallel transistors, exceeds a corresponding gate threshold voltage at block 416 (e.g., while EN_CAP_SHORT is asserted), the associated transistor closes, connecting the ground voltage to an output of the second logic circuit. The output of the second logic circuit may be provided to a second comparator, which may compare the output of the second logic circuit to a threshold, and the output of the second comparator may indicate a short circuit (e.g., causing the CAP_SHORT signal to be asserted to indicate a short between plates of one or more of the flying capacitors) when the output of the second logic circuit is connected to the ground voltage.

If, at block 416 the fault detection module 114 determines that any second terminal voltage of the flying capacitors indicates a short (e.g., CAP_SHORT is asserted), then the method 400 proceeds to block 428 at which the digital FSM 112 causes the control circuitry 110 to disable or otherwise turn off the switched capacitor converter 102 due to the detected fault. Otherwise, if the fault detection module 114 determines that none of the second terminal voltages of the flying capacitors indicate a short (e.g., CAP_SHORT is not asserted), then the method 400 proceeds to block 418.

At block 418, the switched capacitor converter 102 enters a half-sync switching state for the duration of a first timer, causing the control circuitry 110 to control the power stages (e.g., switches thereof) of the switched capacitor converter 102 to operate in a half-sync mode in which, for conversion ratios other than 1:1, half of the switches (e.g., switches S1, S2, S3, and S4 of FIG. 2) are each held at an on state or an off state while the other half of the switches (e.g., switches S5, S6, S7, and S8 of FIG. 2) are periodically switched between off and on states (i.e., open and closed states, respectively). Examples of half-sync switching state operation for various conversion ratios are provided in Table 1, above. In the half-sync switching state, OVPOUT is expected to be equal to or approximately equal to a first target voltage level corresponding to the threshold OVPOUT_TH3. As described above, OVPOUT_TH3, which may be the equal to ((VOUT_0\*X)−Y) where X is an integer that is determined based on to the conversion ratio of the switched capacitor converter 200 (e.g., 4 for 4:1, 2 for 2:1, 1 for 1:1, as non-limiting examples) and where Y is a configurable value between, for example, 2 V and 4 V (e.g., 2 V, 2.5 V, 3 V, or 3.5 V, as non-limiting examples). The method 400 proceeds to the block 416 upon expiration of a first timer.

At block 420, upon expiration of the first timer, the digital FSM 112 compares OVPOUT (sampled by the ADC 122, for example) to the threshold OVPOUT_TH3. If the digital FSM 112 determines that OVPOUT is less than the threshold OVPOUT_TH3, indicating a fault, then then the method 400 proceeds to block 428 at which the digital FSM 112 causes the control circuitry 110 to disable or otherwise turn off the switched capacitor converter 102 due to the detected fault. Otherwise, if the digital FSM 112 determines that OVPOUT is greater than or equal to the threshold OVPOUT_TH3, then the method 400 proceeds to block 422.

At block 422, the switched capacitor converter 102 enters a current-limited full-sync switching state for the duration of a second timer, causing the control circuitry 110 to control the power stages (e.g., switches thereof) of the switched capacitor converter 102 to operate in a full-sync mode (with current limit) in which, for conversion ratios other than 1:1, some or all of the switches of each power stage of the switched capacitor converter 102 are periodically switched between off and on states (i.e., open and closed states, respectively). Examples of full-sync switching state operation for various conversion ratios are provided in Table 2, above. In the current-limited full-sync switching state, OVPOUT is expected to be equal to or approximately equal to a second target voltage level (e.g., V2 of FIG. 3; around N times VOUT given that the switched capacitor converter 102 is configured as a N:1 or 1:N DC-to-DC converter, where N may be 2 or 4 as non-limiting examples). The method 400 proceeds to the block 420 upon expiration of the second timer.

At block 424, the switched capacitor converter 102 enters a full-sync switching state for the duration of a third timer, causing the control circuitry 110 to control the power stages (e.g., switches thereof) of the switched capacitor converter 102 to operate in the full-sync mode, described above, without current limit. In the full-sync switching state, OVPOUT is expected to be equal to or approximately equal to the second target voltage level (e.g., V2 of FIG. 3). The method 400 proceeds to the block 426 upon expiration of the third timer.

At block 426, the digital FSM 112 enables normal operation of the switched capacitor converter 102, causing the control circuitry 110 to control the power stages (e.g., switches thereof) of the switched capacitor converter 102 accordingly (e.g., to provide DC-to-DC conversion between VIN and VOUT with a conversion ratio of 1:4, 1:2, 2:1, or 4:1 as non-limiting examples).

It should be noted that state transitions of the switched capacitor converter (e.g., at blocks 406, 410, 414, 418, 422, and 426) may be controlled by the digital FSM 112 in one or more embodiments.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in one or more embodiments of the depicted subject matter.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments described herein may be implemented entirely in hardware or in an implementation containing both hardware and software elements. In embodiments which use software, the software may include but is not limited to firmware, resident software, microcode, etc.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A system comprising:
a switched capacitor converter configured to perform direct current (DC)-to-DC conversion at a predefined conversion ratio, the switched capacitor converter comprising:
　　a first power stage comprising a first plurality of switches; and
　　a first plurality of capacitors coupled to the first power stage and having first terminals and second terminals;
fault detection circuitry coupled to the second terminals of the first plurality of capacitors of the switched capacitor converter, wherein the fault detection circuitry is configured to:
　　monitor second terminal voltages of the first plurality of capacitors; and
　　assert at least one fault signal in response to determining that any of the second terminal voltages indicates a fault during a startup sequence of switched capacitor converter; and assert the at least one fault signal in response to determining that at least one of the second terminal voltages of the first plurality of capacitors is less than a first threshold voltage during a first time period in which the first terminals of the first plurality of capacitors are coupled to an output voltage of a battery of the system while the second terminals are floating.

2. The system of claim 1, wherein the fault detection circuitry is further configured to disable the switched capacitor converter in response to assertion of the at least one fault signal.

3. The system of claim 1, wherein the fault detection circuitry is further configured to assert the at least one fault signal in response to determining that at least one of the second terminal voltages is greater than a second threshold voltage during a second time period in which the second terminals are coupled to a reference potential while first terminals of the first plurality of capacitors are coupled to the output voltage of the battery of the system.

4. The system of claim 3, wherein the fault detection circuitry further comprises an analog-to-digital converter (ADC), and wherein the fault detection circuitry is further configured to:

obtain, with the ADC, a sampled output voltage value by sampling the output voltage of the battery before the first time period; and store a sampled output voltage value.

5. The system of claim 4, wherein the fault detection circuitry is further configured to:

compare a voltage at an overvoltage protection node coupled to the switched capacitor converter to a third threshold voltage after the first time period of the startup sequence, wherein the third threshold voltage is based on the sampled output voltage value; and disable the switched capacitor converter in response to determining that the voltage at the overvoltage protection node is less than the third threshold voltage.

6. The system of claim 5, wherein the fault detection circuitry is further configured to:

compare the voltage at the overvoltage protection node coupled to the switched capacitor converter to a fourth threshold voltage during a third time period of the startup sequence, wherein the fourth threshold voltage is based on the sampled output voltage value; and disable the switched capacitor converter in response to determining that the voltage at the overvoltage protection node is less than the third threshold voltage during the third time period, wherein the third time period corresponds to a half-sync switching state of the switched capacitor converter, and the third threshold voltage is greater than the output voltage of the battery.

7. The system of claim 1, wherein the first plurality of capacitors includes flying capacitors configured to provide energy storage for the switched capacitor converter.

8. The system of claim 1, wherein the switched capacitor converter further comprises:

a second power stage comprising a second plurality of switches; and a second plurality of capacitors coupled to the first power stage, the second plurality of capacitors being coupled to the fault detection circuitry.

9. A method comprising:

during a startup sequence of a switched capacitor converter:

detecting, by fault detection circuitry coupled to the switched capacitor converter, a fault in the switched capacitor converter based on second terminal voltages of a plurality of flying capacitors of the switched capacitor converter, the plurality of flying capacitors having first terminals and second terminals, wherein detecting the fault comprises:

determining, by the fault detection circuitry, that at least one of the second terminal voltages of the plurality of flying capacitors indicates a capacitor plate short based on comparisons of each of the second terminal voltages to a threshold voltage while the second terminals are coupled to a reference potential and while the first terminals are coupled to an output voltage of a battery; and disabling, by the fault detection circuitry, the switched capacitor converter in response to detecting the fault.

10. A system comprising:

fault detection circuitry configured to receive voltages from a plurality of capacitors of a switched capacitor converter, the plurality of capacitors having first terminals and second terminals, and the fault detection circuitry comprising logic circuitry being configured to:

monitor the voltages in a first state of a startup sequence and a second state of the startup sequence;

assert a first fault signal in response to determining that any of the voltages is greater than a first threshold voltage while in the first state; and assert a second fault signal in response to determining that any of the voltages is less than a second threshold voltage while in the second state, wherein the plurality of capacitors comprises a plurality of flying capacitors of the switched capacitor converter, and wherein voltages received by the fault detection circuitry comprise second terminal voltages of the second terminals of the plurality of flying capacitors, and wherein the fault detection circuitry further comprises a finite state machine (FSM) configured to:

receive the first fault signal and the second fault signal from the logic circuitry; and disable the switched capacitor converter in response to assertion of either of the first fault signal or the second fault signal.

11. The system of claim 10, wherein the fault detection circuitry further comprises an analog-to-digital converter (ADC) configured to:

sample voltages from each of an overvoltage protection node coupled to the switched capacitor converter and an output node of a battery coupled to the switched capacitor converter; and provide the sampled voltages to the FSM.

12. The system of claim 11, wherein the FSM is further configured to transition to the first state of a startup sequence of the switched capacitor converter in response to determining that a voltage at the overvoltage protection node is less than a third threshold voltage.

13. The system of claim 12, wherein the FSM is further configured to:

compare the voltage at the overvoltage protection node to a fourth threshold voltage after the first state of the startup sequence, wherein the fourth threshold voltage is based on a sampled output voltage value obtained and stored by the fault detection circuitry prior to the first state.

14. The system of claim 13, wherein the FSM is further configured to:

compare the voltage at the overvoltage protection node to a fifth threshold voltage during a third state of the startup sequence corresponding to a half-sync switching state of the switched capacitor converter, wherein the fifth threshold voltage is greater than an output voltage of the battery.

15. The system of claim 14, wherein the FSM is further configured to:

disable the switched capacitor converter in response to determining that:

the voltage at the overvoltage protection node is less than the fourth threshold voltage following the first state; or the voltage at the overvoltage protection node is less than the fifth threshold voltage at an end of the third state.

\* \* \* \* \*